(12) United States Patent
Takubo et al.

(10) Patent No.: US 8,334,497 B2
(45) Date of Patent: Dec. 18, 2012

(54) IMAGE SENSOR COMPRISING A WAVEGUIDE STRUCTURE AND IMAGING APPARATUS

(75) Inventors: Yousuke Takubo, Tokyo (JP); Seiichi Miyazawa, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 641 days.

(21) Appl. No.: 12/539,322

(22) Filed: Aug. 11, 2009

(65) Prior Publication Data

US 2010/0053390 A1    Mar. 4, 2010

(30) Foreign Application Priority Data

Aug. 27, 2008    (JP) ................................. 2008-218818

(51) Int. Cl.
*G02B 27/10* (2006.01)
(52) U.S. Cl. ..................... 250/214.1; 257/432; 250/226; 250/208.1; 348/340
(58) Field of Classification Search .............. 250/208.1, 250/214.1; 257/292, 396, 446, 432, 233
See application file for complete search history.

(56) References Cited

U.S. PATENT DOCUMENTS 7,728,278 B2 *   6/2010  Roy et al. .................... 250/214.1
2005/0236553 A1 *  10/2005  Noto et al. .................. 250/208.1

FOREIGN PATENT DOCUMENTS

| JP | 2002-118245 | 4/2002 |
|---|---|---|
| JP | 2002-246579 | 8/2002 |
| JP | 2006-222366 | 8/2006 |

\* cited by examiner

*Primary Examiner* — Tony Ko
(74) *Attorney, Agent, or Firm* — Cowan, Liebowitz & Latman, P.C.

(57) ABSTRACT

An image sensor includes a pixel array with a plurality of pixels, wherein each of the plurality of pixels includes: a photoelectric conversion unit; and a waveguide structure in which a side face of a substance that has a higher refractive index than a refractive index of a plurality of insulation films is surrounded by the plurality of insulation films so that light is guided to the photoelectric conversion unit, and wherein an insulation film that surrounds a region where the light is concentrated of the side face of the substance has the lowest refractive index among the plurality of insulation films.

10 Claims, 5 Drawing Sheets

IMAGE SENSOR COMPRISING A WAVEGUIDE STRUCTURE AND IMAGING APPARATUS

BACKGROUND OF THE INVENTION

1. Field of the Invention

The present invention relates to an image sensor and an imaging apparatus.

2. Description of the Related Art

Image sensors such as CCD image sensors and CMOS image sensors include a one- or two-dimensional pixel array with a plurality of pixels. In recent years, the number of pixels in the pixel array of an image sensor has increased in order to capture high-definition images. Some image sensors for use in imaging apparatuses, such as digital video cameras or digital still cameras, now have as many as several million pixels or more in their pixel arrays.

Each pixel in a pixel array generates an image signal when incident light reaches a light receiving surface of a photodiode and the photodiode photoelectrically converts the received light. Thus, it is important to efficiently guide the light incident on a pixel to a photodiode in the pixel. In other words, assuming that "light utilization efficiency" is a ratio of an amount of light reaching a photodiode to an amount of light incident on a pixel, an improvement of the light utilization efficiency has a significant effect on improvements in image sensor performance.

Also, with increasing needs to develop more compact imaging apparatuses and smaller image sensors in recent years, image sensors are required to ensure sufficient light utilization efficiency not only with light incident at a small angle but also with light incident at a large angle.

To meet this demand, Japanese Patent Laid-Open No. 2002-246579 has described a configuration of a solid-state imaging device in which a non-through hole 108 formed by removing a portion above the photoelectric conversion element 100 from an interlayer insulator film 102 is filled with a transparent material 203 that has a refractive index higher than that of the interlayer insulating film 102, as illustrated in FIG. 3 of Japanese Patent Laid-Open No. 2002-246579.

In addition, Japanese Patent Laid-Open No. 2002-118245 has described a configuration of a solid-state imaging device in which an optical waveguide hole 5 formed by removing a portion above a surface of a light receiving unit 2 from an insulating layer 3 is filled with a material 13 that has a refractive index higher than that of the insulating layer 3, as illustrated in FIG. 3 of Japanese Patent Laid-Open No. 2002-118245.

In the configuration illustrated in FIG. 3 of Japanese Patent Laid-Open No. 2002-246579, the side face of the waveguide is made of one kind of material.

In the configuration illustrated in FIG. 3 of Japanese Patent Laid-Open No. 2002-118245, only the insulating layer 3 is in contact with the material 13 at the side wall of the optical waveguide 5a.

With this configuration, if the insulating layer 3 is formed of a material that has a refractive index sufficiently lower than that of the material 13, it may be difficult to ensure a required mechanical strength of the insulating layer 3 when a material with a sufficiently low refractive index has low mechanical strength.

If the insulating layer 3 is formed of a porous CDO (carbon-doped oxide) that has a refractive index of 1.3, a difference in refractive index between the material 13 and the insulating layer 3 at the side face of the optical waveguide 5a is larger than in the case where the insulating layer 3 is formed of a silicon oxide that has a refractive index of 1.4. However, in this case, it may be difficult to ensure the required mechanical strength of the insulating layer 3.

SUMMARY OF THE INVENTION

The present invention provides for improving an ratio of a amount of light reaching a photoelectric conversion unit to an amount of light incident on a pixel while suppressing a reduction in a mechanical strength of a waveguide structure.

An image sensor according to a first aspect of the present invention comprises a pixel array with a plurality of pixels, wherein each of the plurality of pixels includes: a photoelectric conversion unit; and a waveguide structure in which a side face of a substance that has a higher refractive index than a refractive index of a plurality of insulation films is surrounded by the plurality of insulation films so that light is guided to the photoelectric conversion unit, and wherein an insulation film that surrounds a region where the light is concentrated of the side face of the substance has the lowest refractive index among the plurality of insulation films.

An imaging apparatus according to a second aspect of the present invention comprises: an image sensor according to the first aspect of the present invention; an optical system that forms an image on an imaging surface of the image sensor; and a signal processing unit that processes a signal output from the image sensor so as to generate image data.

An image sensor according to a third aspect of the present invention comprises a pixel array with a plurality of pixels, wherein each of the plurality of pixels includes: a photoelectric conversion unit; and a waveguide structure in which a side face of a substance that has a higher refractive index than a refractive index of a plurality of insulation films is surrounded by the plurality of insulation films so that light is guided to the photoelectric conversion unit, and wherein the plurality of insulation films includes a first insulation film that insulates a first wiring layer from a semiconductor substrate and a second insulation film that is arranged on the first insulation film and insulates a second wiring layer from the first wiring layer, a refractive index of the second insulation film is lower than that of the first insulation film.

An imaging apparatus according to a fourth aspect of the present invention comprises: an image sensor according to the third aspect of the present invention; an optical system that forms an image on an imaging surface of the image sensor; and a signal processing unit that processes a signal output from the image sensor so as to generate image data.

The present invention can improve the ratio of the amount of light reaching the photoelectric conversion unit to the amount of light incident on the pixel while suppressing a reduction in the mechanical strength of the waveguide structure.

Further features of the present invention will become apparent from the following description of exemplary embodiments with reference to the attached drawings.

DESCRIPTION OF THE EMBODIMENTS

Figure 6:
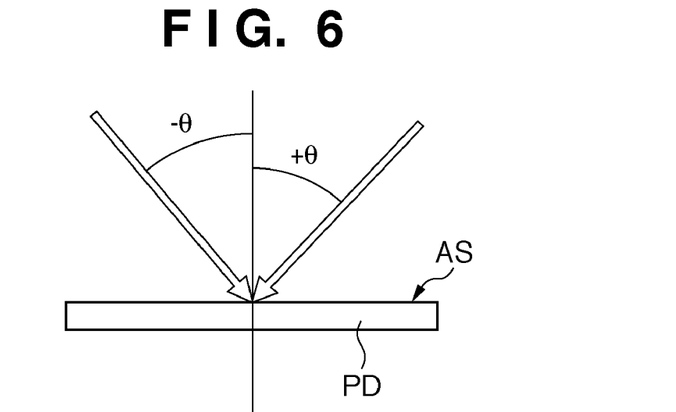
FIG. 6 is a diagram for defining an incident angle.

In the specification of the present invention, the term "incident angle" is defined as shown in FIG. 6. An angle of incident light strict perpendicular to a light receiving surface AS of an imaging device (i.e. an image sensor) shall be zero degrees. An angle of incident light in any arbitrary plane that is perpendicular to the light receiving surface AS of an imaging device can be positive or negative, as illustrated in FIG. 6. What the incident angle is large means that an absolute value of the incident angle is large. What the incident angle is small means that an absolute value of the incident angle is small. That is, a large incident angle indicates a large absolute value of the angle of incident light, and a small incident angle indicates a small absolute value of the angle of incident light.

Also, in the specification of the present invention, the term "light utilization efficiency" refers to a ratio of an amount of light reaching a photoelectric conversion unit PD to an amount of light incident on a pixel.

Problems to be solved by the present invention are described in detail with reference to the drawings.

Figure 7:
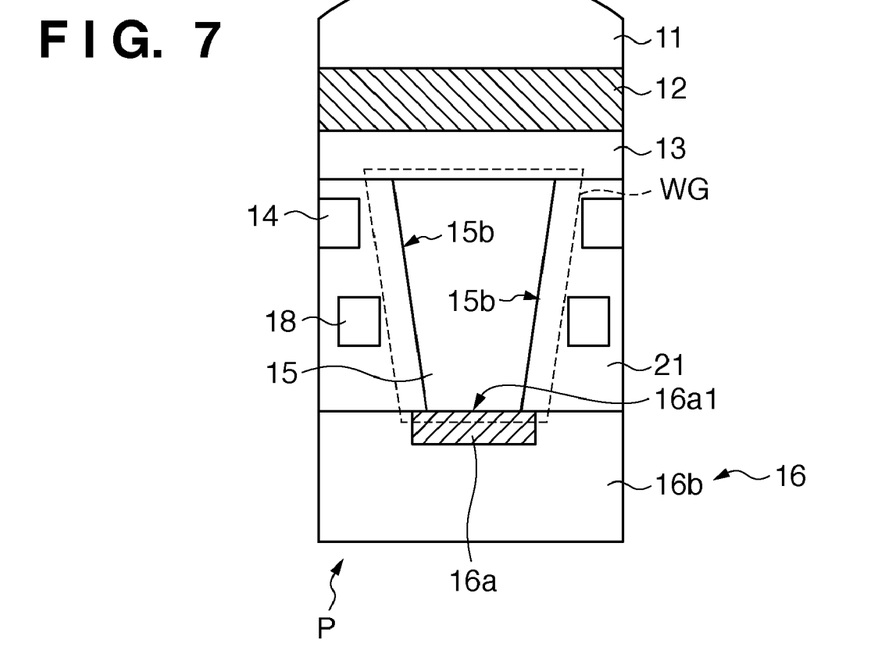
FIG. 7 is a diagram for explaining problems to be solved by the present invention.

FIG. 7 illustrates one example of a cross-sectional structure of a pixel P in an image sensor.

The pixel P shown in FIG. 7 includes a microlens 11, a color filter 12, a planarization layer 13, a waveguide structure WG, and a photoelectric conversion unit 16a.

The microlens 11 refracts and transmits received light so that the light is incident on the photoelectric conversion unit 16a. The microlens 11 is formed of, for example, a resin material that has a refractive index of approximately 1.6.

The color filter 12 is provided on the planarization layer 13. The color filter 12 selectively allows light of a predetermined wavelength, from among the light having passed through the microlens 11, to pass through so that the light of a predetermined wavelength is incident on the photoelectric conversion unit 16a.

The planarization layer 13 is located on the waveguide structure WG. The planarization layer 13 provides a flat surface. The light passes through the planarization layer 13 after passing through the color filter 12. The planarization layer 13 is formed of, for example, silicon oxide ($SiO_2$) that has a refractive index of approximately 1.4.

The waveguide structure WG is configured such that a side face 15b of a substance 15 that has a refractive index higher than that of an insulation film 21 is surrounded by the insulation film 21 so that light is guided to the photoelectric conversion unit 16a.

The insulation film 21 is provided so as to insulate a semiconductor substrate 16, a wiring layer 14, and a wiring layer 18 from one another. The wiring layers 14 and 18 respectively transfer a signal according to charges generated by the photoelectric conversion unit 16a. The wiring layers 14 and 18 are formed of, for example, aluminum or copper.

The substance 15 is formed of a transparent material so as to guide light to the photoelectric conversion unit 16a. The substance 15 is formed of, for example, silicon nitride (SiN) that has a refractive index of approximately 1.8, or a resin material that has a refractive index of approximately 1.6.

In the waveguide structure WG, since the refractive index of the substance 15 is higher than that of the insulation film 21, the light guided to the substance 15 is totally reflected off the side face 15b of the substance 15 and guided to a light receiving surface 16a1 of the photoelectric conversion unit 16a. In other words, the waveguide structure WG suppresses the dissipation of light incident on the substance 15 to the outside of the substance 15, thereby improving the light utilization efficiency.

The photoelectric conversion unit 16a generates charges by photoelectrically converting light guided to the receiving face 16a1. The photoelectric conversion unit 16a is, for example, a photodiode.

The photoelectric conversion unit 16a is formed as an impurity-containing semiconductor region in the semiconductor substrate 16. For example, a photoelectric conversion unit 16a that contains n-type impurities is formed surrounded by a well 16b that contains p-type impurities, in the semiconductor substrate 16.

The pixel P shown in FIG. 7 is configured so that the side face 15b of the substance 15 is surrounded by only the insulation film 21 in the waveguide structure WG. With this configuration, if the insulation film 21 is formed of a material that has a refractive index sufficiently lower than that of the substance 15, it may be difficult to ensure a required mechanical strength of the insulation film 21 when a material with a sufficiently low refractive index has low mechanical strength.

For example, consider a case where the insulation film 21 is formed of a porous CDO (carbon-doped oxide) that has a refractive index of 1.3. In this case, a difference in refractive indices between the substance 15 and the insulation film 21 at the side face 15b of the substance 15 is larger than in a case where the insulation film 21 is formed of a silicon oxide that has a refractive index of 1.4. Therefore, the light guided to the substance 15 is more likely to be totally reflected off the side face 15b of the substance 15. However, in this case, it may be difficult to ensure the required mechanical strength of the insulation film 21. That is, a mechanical strength of the waveguide structure WG may be reduced below the required mechanical strength.

Alternatively, consider a case where the insulation film 21 is formed of a material whose refractive index and relative dielectric constant are both lower than those of a silicon oxide. In this case, a difference in refractive indices between the substance 15 and the insulation film 21 at the side face 15b of the substance 15 is larger than in the case where the insulation film 21 is formed of a silicon oxide. Therefore, the light guided to the substance 15 is more likely to be totally reflected off the the side face 15b of the substance 15. However, in this case, it may be difficult to ensure a required electrical insulation performance of the insulation film 21.

Figure 8:
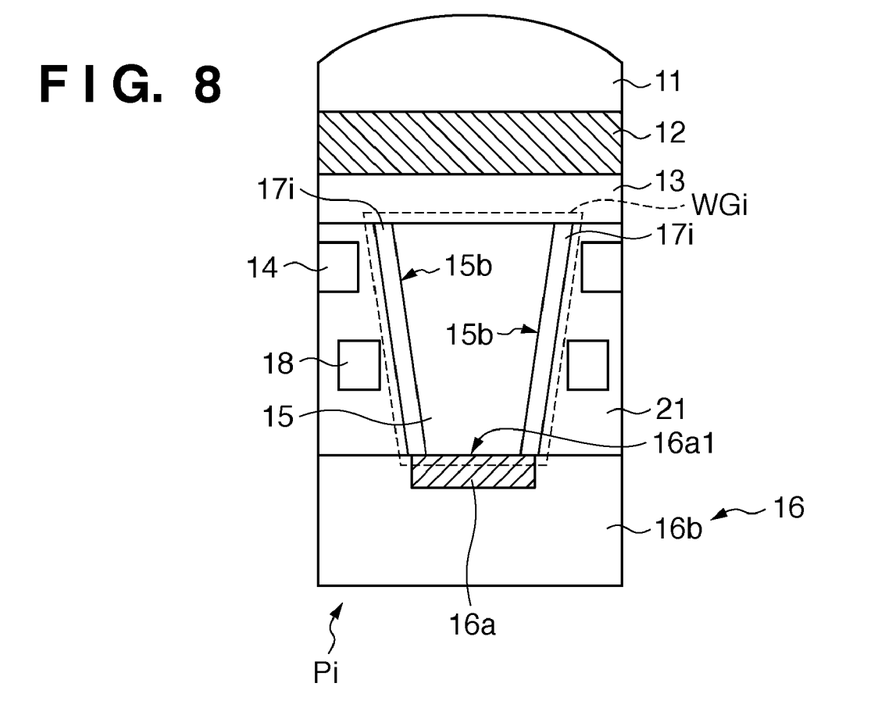
FIG. 8 is a diagram for explaining problems to be solved by the present invention.

FIG. 8 illustrates another example of a cross-sectional structure of a pixel Pi in an image sensor. A description is given with emphasis on the aspects that differ from those in the cross-sectional structure of the pixel P as shown in FIG. 7.

The pixel Pi shown in FIG. 8 differs in its waveguide structure WGi from the pixel P shown in FIG. 7.

The waveguide structure WGi is an air-gap structure in which a gap 17i is provided between the substance 15 and the insulation film 21 so that light is guided to the photoelectric conversion unit 16a. The gap 17i is either filled with a given gas (air, an inert gas, etc.) or in a near-vacuum state. Thus, the refractive index of a member 16 is higher than that (e.g., 1.0) of the gap 17i.

In this case, a difference in refractive indices between the substance 15 and the gap 17i at the side face 15b of the substance 15 is larger than in the case where the waveguide structure WGi (see FIG. 7) is configured so that the side face 15b of the substance 15 is surrounded by the insulation film 21. Thus, the light guided to the substance 15 is even more likely to be totally reflected off the side face 15b of the substance 15. However, in this case, it may be difficult to ensure the required mechanical strength of the insulation film 21. That is, the mechanical strength of the waveguide structure WGi may be reduced below the required mechanical strength.

Further, a non-conventional process technique, such as temporarily forming a prescribed film of a different material between the substance 15 and the insulation film 21 and then selectively removing the prescribed film by a dry etching or a wet etching technique, is necessary in order to form the gap 17i. This may complicate the process of manufacturing an image sensor.

Figure 1:
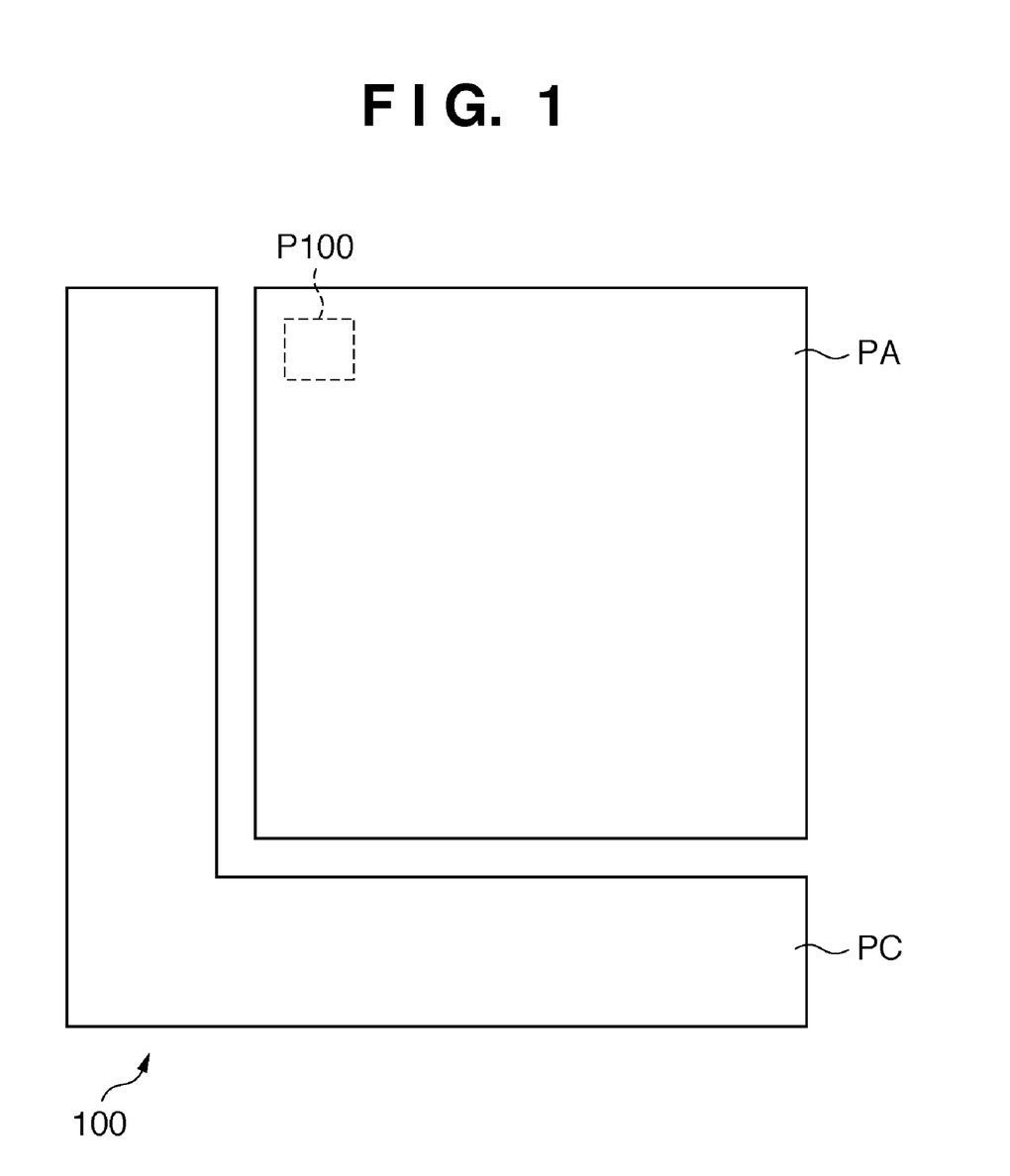
FIG. 1 illustrates a configuration of an image sensor 100 according to a first exemplary embodiment of the present invention.

A schematic configuration of an image sensor 100 according to a first exemplary embodiment of the present invention is described with reference to FIG. 1. FIG. 1 illustrates a configuration of the image sensor 100 according to the first exemplary embodiment of the present invention.

The image sensor 100 includes a pixel array PA and a peripheral circuit PC. In the pixel array PA, a plurality of pixels P100 are arranged in directions along a row and a column. The peripheral circuit PC is located on the periphery of the pixel array PA.

A case where the image sensor 100 is a CMOS image sensor is described. The peripheral circuit PC includes: a vertical scanning circuit for driving each pixel P100; a readout circuit that reads out signals from pixels P100 and holds the signals; an output circuit; and a horizontal scanning circuit that transfers a signal among the signals held in the readout circuit to the output circuit.

Each pixel P100 includes a photoelectric conversion unit, a transfer unit, a charge-voltage converter, a reset unit, and an output unit. The photoelectric conversion unit generates charges according to light and accumulates the generated charges as a signal. The photoelectric conversion unit is, for example, a photodiode. The transfer unit transfers the charges generated by the photoelectric conversion unit to the charge-voltage converter. The transfer unit is, for example, a transfer MOS transistor that is turned on and performs a transfer operation when an active-level transfer control signal is supplied from the vertical scanning circuit to the gate (transfer electrode). The charge-voltage converter converts the transferred charges into a voltage. The charge-voltage converter is, for example, a floating diffusion (FD). The reset unit resets the charge-voltage converter. The reset unit is, for example, a reset MOS transistor that is turned on and performs a reset operation when an active-level reset control signal is supplied from the vertical scanning circuit to the gate. The output unit outputs a signal according to a voltage of the charge-voltage converter to a signal line. The output unit is, for example, an amplification MOS transistor that receives the voltage of the charge-voltage converter at its gate and outputs a signal according to the voltage via its source to a signal line.

Note that a case where the image sensor 100 is a CCD image sensor is different from the above-described case in that the transfer unit, the charge-voltage converter, the reset unit, and the output unit are included not in each pixel P100 but in the peripheral circuit PC. In the case of a CCD image sensor, the transfer unit includes, for example, a vertical transfer CCD and a horizontal transfer CCD and performs transfer operations according to phases of transfer control signals supplied to the transfer electrodes.

Figure 2:
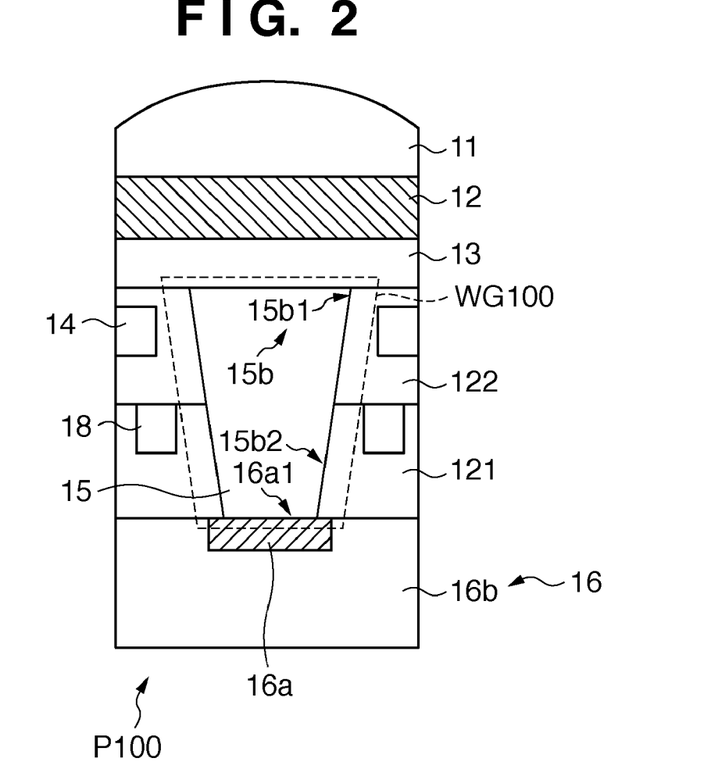
FIG. 2 illustrates a cross-sectional structure of a pixel P100 in a pixel array PA of the image sensor 100 according to the first exemplary embodiment of the present invention.

The cross-sectional structure of each pixel P100 is described with reference to FIG. 2. FIG. 2 illustrates a cross-sectional structure of a pixel P100 in the pixel array PA of the image sensor 100 according to the first exemplary embodiment of the present invention. A description is hereinafter given with emphasis on those aspects that differ from those of the pixel P shown in FIG. 7 and the pixel Pi shown in FIG. 8.

A pixel P100 differs in its waveguide structure WG100 from the pixel P shown in FIG. 7 and the pixel Pi shown in FIG. 8.

The waveguide structure WG100 is configured so that a side face 15b of a substance 15 that has a refractive index higher than those of a plurality of insulation films 121 and 122 is surrounded by the plurality of insulation films 121 and 122 so that light is guided to a photoelectric conversion unit 16a.

Note that light incident on a pixel located in a central region (i.e. a region near the center) in the pixel array of the image sensor 100 includes not only light incident at zero degrees but also light incident at a certain range of angles including the zero degrees in accordance with characteristics of the optical system. Similarly, light incident on a pixel located in a peripheral region (i.e. a region at the outer side of the central region) in the pixel array includes light at a certain range of angles depending on the position of the pixel in accordance with characteristics of the optical system. In other words, light at a certain range of incident angles is incident on every pixel, including both those pixels located in the central region in the pixel array and those located in the peripheral region in the pixel array.

Specifically, when light is incident at an inclined angle instead of strict perpendicularly from above a pixel, an increase in a incident angle of the incident light cause a region where the light is concentrated by the microlens 11 to shift transversely from the center of the light receiving surface 16a1 of the photoelectric conversion unit 16. As a result, when viewed in a section as shown in FIG. 2, incident light is concentrated on an upper portion of the side face of the substance 15 in the waveguide structure WG100. In particular, light incident on a pixel in the peripheral region in the pixel array includes light incident at a large incident angle in more percentage than that of light incident on a pixel in the central region in the pixel array. Therefore, more percentage of light is concentrated on an upper portion of the side face of the substance 15 in the waveguide structure WG100 in a pixel in the peripheral region than in a pixel in the central region.

When light is incident at a small incident angle, the incident light can be concentrated on a lower portion of the side face of the substance 15 in the waveguide structure WG100. When light is concentrated on the lower portion of the side face of the substance 15, an angle formed by the side face of the substance 15 and the light beam is smaller than in the case where the light is concentrated on the upper portion of the side face. In the case where light is concentrated on the lower portion of the side face, the light can be totally reflected off the side face even with a small difference in refractive index between the waveguide and the insulating films. Besides, in this case, since the region where the light is concentrated is near the light receiving surface 16a1 of the photoelectric conversion unit 16, a rate of an amount of light concentrated on the side face to an amount of light received by the photoelectric conversion unit is high even if the light is not totally reflected off the side face of the substance 15. However, even in this case, efforts to achieve total light reflection off the lower portion (i.e. the region where the light is concentrated)

of the side face of the substance 15 can be effective in improving the rate at which the photoelectric conversion unit receives light.

On the other hand, when light is incident at a large incident angle, the incident light can be concentrated on the upper portion of the side face of the substance 15 in the waveguide structure WG100. When light is concentrated on the upper portion of the side face of the substance 15, an angle formed by the side face of the substance 15 and the light beam is larger than in the case where the light is concentrated on the lower portion of the side face. In the case where light is concentrated on the upper portion of the side face, the light that is not totally reflected off the upper part of the side face of the substance 15 is hardly received by the photoelectric conversion unit 16, thereby generating noise. Thus, in this case, efforts to achieve total light reflection off the upper portion (i.e. the region where the light is concentrated) of the side face of the substance 15 can be significantly effective in improving the rate at which the photoelectric conversion unit receives light.

In view of this, the present exemplary embodiment describes a case where light is incident at a large incident angle in a pixel. The present exemplary embodiment employs a material Among the plurality of insulation films 121 and 122 that surrounds the side face 15*b* of the substance 15, a material of the insulation film 122 which surrounds the upper portion (i.e. the region where the light is concentrated) of the side face is configured to have a refractive index lower than that of the other insulation film 121. In other words, the insulation film 122 that surrounds a region where the light is concentrated of the side face 15*b* of the substance 15 has the lowest refractive index among the plurality of insulation films 121 and 122.

In this case, the region where the light is concentrated can be an upper part 15*b*1 of the side face 15*b* of the substance 15. The plurality of insulation films 122 and 121 are arranged in ascending order of refractive index from the upper part 15*b*1 to the lower part 15*b*2 of the side face 15*b* of the substance 15. Specifically, if n1 is the refractive index of the insulation film 121, n2 is the refractive index of the insulation film 122, and n0 is the refractive index of the substance 15, the following mathematical expression (1) holds:

$$n2 < n1 < n0 \quad (1)$$

For example, Mathematical Expression 1 holds in the following case.

Assume, for example, that the insulation film 122 is formed of a porous CDO (carbon-doped oxide) that has a refractive index of approximately 1.3. In this case, n2=1.3. The insulation film 121 may be formed of, for example, a silicon oxide ($SiO_2$) that has a refractive index of approximately 1.4. In this case, n1=1.4. The substance 15, like the microlens, may be formed of, for example, a resin material that has a refractive index of approximately 1.6. In this case, n0=1.6. By selectively increasing a difference in refractive indices between the substance 15 and the insulation film 122 in the region where the light is concentrated, the incident light can be effectively guided to the photoelectric conversion unit 16 by total reflection off the region where the light is concentrated.

It should be noted that the insulation film 121 insulates the wiring layer 18 from the semiconductor substrate 16. The insulation film 122 is arranged on the insulation film 121 and insulates the wiring layer 14 from the wiring layer 18. A refractive index of the insulation film 122 is lower than a refractive index of the insulation film 121.

Figure 3:
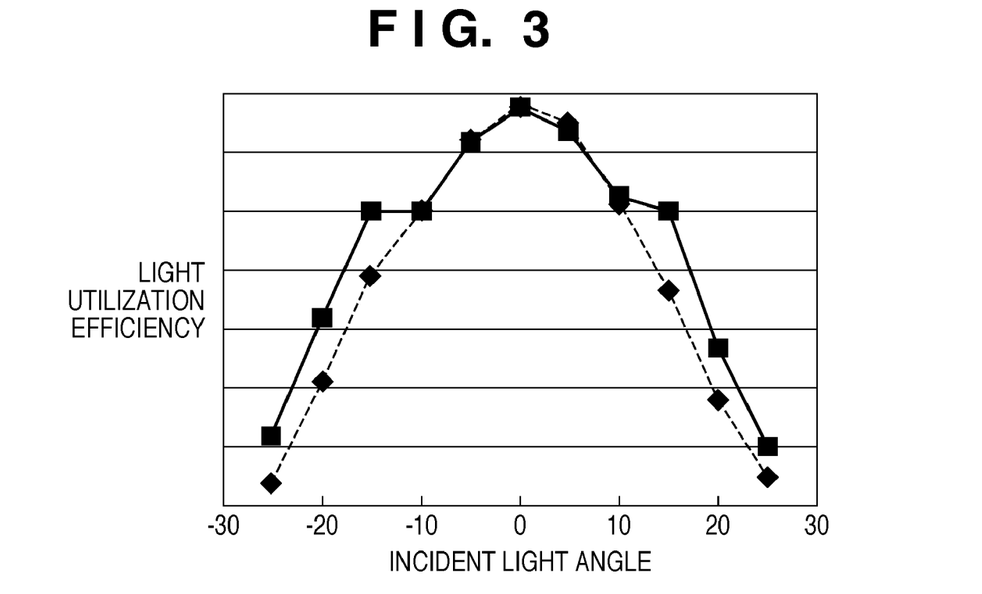
FIG. 3 shows simulation results for numerical calculations of light utilization efficiency of the pixel P100, using the FDTD method.

The simulation results for numerical calculations of the light utilization efficiency of the pixel P100, which is formed of the materials described above, are shown in FIG. 3. FIG. 3 shows the simulation results for numerical calculations of the light utilization efficiency of the pixel P100, using the FDTD method. In FIG. 3, the horizontal axis indicates the incident angle of light incident on each pixel as defined in FIG. 6, and the vertical axis indicates the light utilization efficiency, that is, the ratio of the amount of light reaching the photoelectric conversion unit to the amount of light incident on the pixel P100.

As shown in FIG. 3, the light utilization efficiency of the pixel P100 indicated by the solid line shows improvements in particular when the incident angle is large, as compared with the light utilization efficiency of the pixel P (see FIG. 7) indicated by the broken line. For instance, the light utilization efficiency of the pixel P100 shows an improvement of 1.2 times or more when the incident angle is 15 or 20 degrees, as compared with the light utilization efficiency of the pixel P.

As described above, according to the present exemplary embodiment, among the plurality of insulation films 121 and 122 that surrounds the side face 15*b* of the substance 15, a refractive index of the insulation film 122 that surrounds the region where the light is concentrated is configured to be lower than that of the other insulation film 121. In other words, the insulation film 122 that surrounds a region where the light is concentrated of the side face 15*b* of the substance 15 has the lowest refractive index among the plurality of insulation films 121 and 122. This readily allows an improvement in the ratio of the amount of light reaching the photoelectric conversion unit to the amount of light incident on the pixel, that is, the light utilization efficiency of the pixel.

Moreover, in the case where the insulation film 122 is formed of a material whose refractive index is sufficiently lower than that of the substance 15, even if the material with the sufficiently low refractive index has a low mechanical strength, the other insulation film 121 may be formed of a material that has a high mechanical strength. In this case, the required mechanical strength can be ensured with the plurality of insulation films 121 and 122 as a whole.

In other words, the present exemplary embodiment can improve the ratio of the amount of light reaching the photoelectric conversion unit to the amount of light incident on the pixel while suppressing the reduction in the mechanical strength of the waveguide structure.

Note that the waveguide structure may include two or more insulation films.

Figure 4:
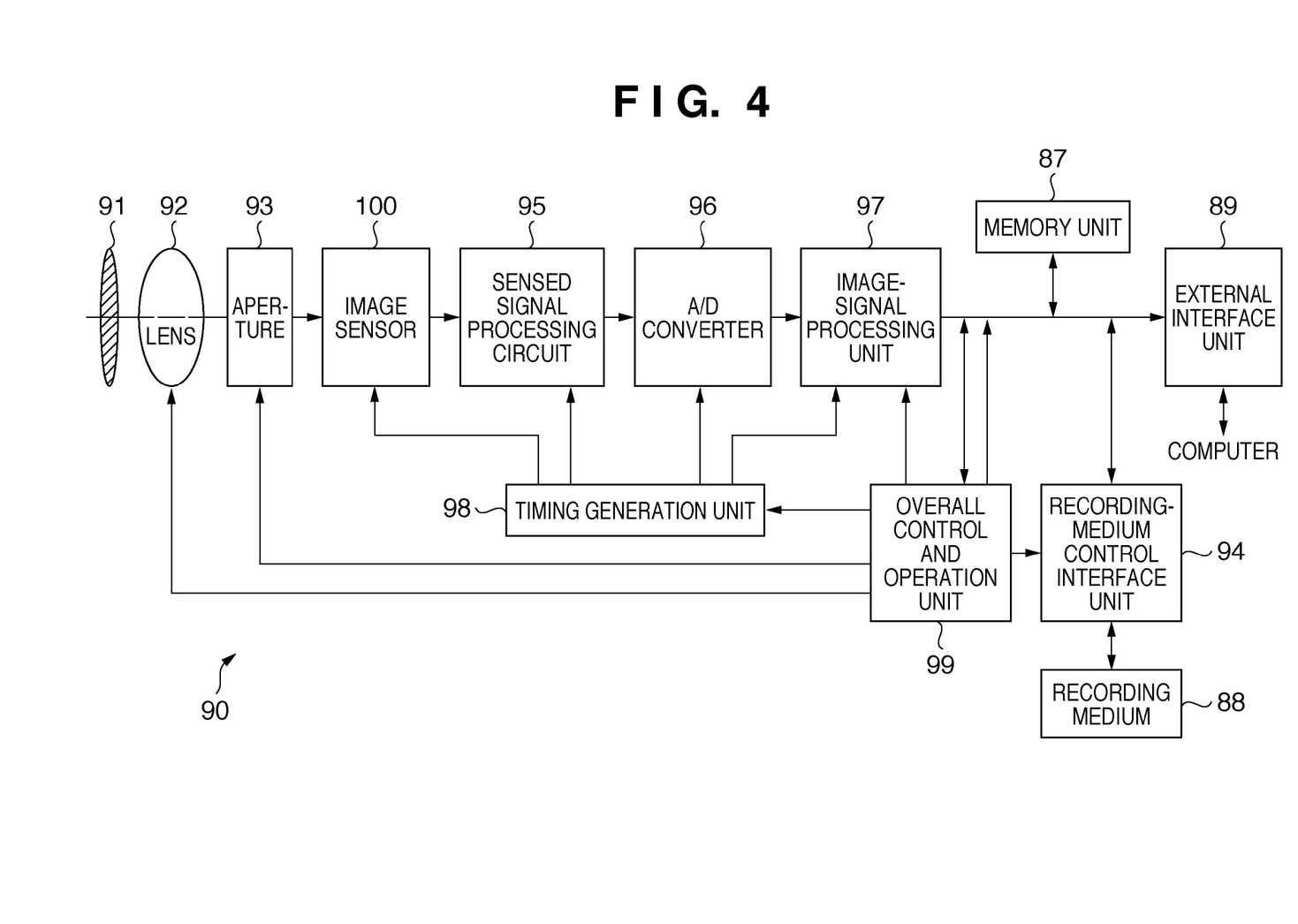
FIG. 4 is a block diagram of an imaging system that applies the image sensor 100 according to the first exemplary embodiment.

An exemplary imaging apparatus that adopts an image sensor according to the present invention is shown in FIG. 4.

An imaging apparatus 90, as shown in FIG. 4, primarily includes an optical system, the image sensor 100, and a signal processing unit. The optical system primarily includes a shutter 91, a lens 92 and an aperture 93. The signal processing unit primarily includes an sensed signal processing circuit 95, an A/D converter 96, an image-signal processing unit 97, a memory unit 87, an external interface unit 89, a timing generation unit 98, an overall control and operation unit 99, a recording medium 88, and a recording-medium control interface unit 94. Note that the signal processing unit may not include the recording medium 88.

The shutter 91 is provided on an optical path in front of the lens 92 in order to control exposure.

The lens 92 refracts incident light and forms an image of an object on a pixel array (imaging surface) of the image sensor 100.

The aperture 93 is provided on the optical path between the lens 92 and the image sensor 100 and controls the amount of light that is guided to the image sensor 100 after having passed through the lens 92.

The image sensor 100 converts an image of an object formed on the pixel array into an image signal. The image sensor 100 reads out the image signal from the pixel array and outputs the signal.

The sensed signal processing circuit 95 is connected to the image sensor 100 and processes image signals output from the image sensor 100.

The A/D converter 96 is connected to the sensed signal processing circuit 95 and converts an image signal (analog signals) that has been processed and output from the sensed signal processing circuit 95 into an image signal (digital signals).

The image-signal processing unit 97 is connected to the A/D converter 96 and performs a variety of computations, such as correction, on the image signal (digital signals) output from the A/D converter 96 so as to generate image data. Such image data is supplied to the memory unit 87, the external interface unit 89, the overall control and operation unit 99, the recording-medium control interface unit 94, and the like.

The memory unit 87 is connected to the image-signal processing unit 97 and stores image data output from the image-signal processing unit 97.

The external interface unit 89 is connected to the image-signal processing unit 97. This enables image data output from the image-signal processing unit 97 to be transferred to external equipment (e.g., a PC) through the external interface unit 89.

The timing generation unit 98 is connected to the image sensor 100, the sensed signal processing circuit 95, the A/D converter 96, and the image-signal processing unit 97. This enables the supply of a timing signal to the image sensor 100, the sensed signal processing circuit 95, the A/D converter 96, and the image-signal processing unit 97. Thus, the image sensor 100, the sensed signal processing circuit 95, the A/D converter 96, and the image-signal processing unit 97 will operate in synchronization with the timing signal.

The overall control and operation unit 99 is connected to the timing generation unit 98, the image-signal processing unit 97, and the recording-medium control interface unit 94 and performs overall control operations over the timing generation unit 98, the image-signal processing unit 97, and the recording-medium control interface unit 94.

The recording medium 88 is removably connected to the recording-medium control interface unit 94. This enables image data output from the image-signal processing unit 97 to be recorded on the recording medium 88 through the recording-medium control interface unit 94.

With the configuration described above, as long as the image sensor 100 obtains favorable image signals, an excellent image (image data) can be obtained.

Figure 5:
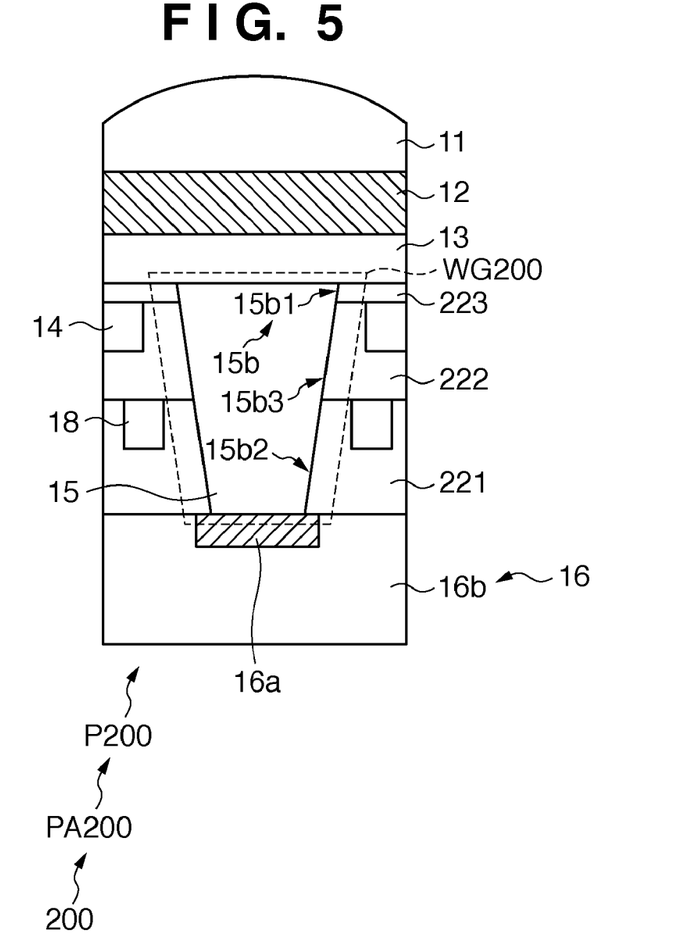
FIG. 5 illustrates a cross-sectional structure of a pixel P200 in a pixel array PA200 of an image sensor 200 according to a second exemplary embodiment of the present invention.

An image sensor 200 according to a second exemplary embodiment of the present invention is described with reference to FIG. 5. FIG. 5 illustrates a cross-sectional structure of a pixel P200 in a pixel array PA200 of the image sensor 200 according to the second exemplary embodiment of the present invention. A description is hereinafter given with emphasis on the aspects that differ from those in the first exemplary embodiment.

Note that which portion of the side face of the substance in the waveguide structure is the region where light is concentrated may be controlled by adjusting the width of each pixel, the height of the microlens 11, the thicknesses of the planarization layer 13 and the wiring layers, and the like. If the region where light is concentrated is controlled to be a lower or middle portion of the side face of the substance in the waveguide structure, a dielectric film having a low refractive index may be provided in the lower or middle portion of the side face. The second exemplary embodiment describes a case where the region where light is concentrated is controlled to be the middle portion of the side face of the substance.

The image sensor 200 includes a pixel array PA200. The pixel array PA200 is provided with a plurality of pixels P200.

The pixels P200 differ in their waveguide structure WG200 from the pixels in the first exemplary embodiment.

The region where light is concentrated in the waveguide structure WG200 is a middle portion 15b3 between an upper part 15b1 and a lower part 15b2 of the side face 15b of the substance 15. A plurality of insulation films 221, 222, and 223, which form the waveguide structure WG200, are arranged so that the refractive index decreases and then increases from the upper portion 15b1 to the lower portion 15b2 of the side face 15b of the substance 15. Specifically, if n21 is the refractive index of the insulation film 221, n22 is the refractive index of the insulation film 222, n23 is the refractive index of the insulation film 223, and n0 is the refractive index of the substance 15, any one of the following mathematical expressions (2) to (4) hold:

$$n23 > n21 > n22 \quad (2), \text{ or}$$

$$n21 > n23 > n22 \quad (3), \text{ or}$$

$$n21 = n23 > n22 \quad (4)$$

For instance, Mathematical Expression (2) holds in the following case.

The insulation film 223 may be formed of, for example, SiOC that has a refractive index of approximately 1.5. In this case, n23=1.5. The insulation film 221 may be formed of, for example, a silicon oxide ($SiO_2$) that has a refractive index of approximately 1.4. In this case, n21=1.4. The insulation film 222 may be formed of, for example, a porous CDO (carbon-doped oxide) that has a refractive index of approximately 1.3. In this case, n22=1.3. In this example, the mathematical expression (2) holds.

As described above, according to the present exemplary embodiment, among the plurality of insulation films 221, 222, and 223 that surrounds the side face 15b of the substance 15, a refractive index of the insulation film 222 that surrounds the region where light is concentrated is configured to be lower than those of the other insulation films 221 and 223. In other words, the insulation film 222 that surrounds a region where the light is concentrated of the side face 15b of the substance 15 has the lowest refractive index among the plurality of insulation films 221, 222 and 223. This readily allows an improvement in the ratio of the amount of light reaching the photoelectric conversion unit to the amount of light incident on the pixel, that is, the light utilization efficiency of the pixel.

Moreover, in the case where the insulation film 222 is formed of a material whose refractive index is sufficiently lower than that of the substance 15, even if the material with the sufficiently low refractive index has a low mechanical strength, the other insulation films 221 and 223 may be formed of materials that have high mechanical strengths. In this case, the required mechanical strength can be ensured with the plurality of insulation films 221, 222, and 223 as a whole.

In other words, the present exemplary embodiment can improve the ratio of the amount of light reaching the photoelectric conversion unit to the amount of light incident on the pixel while suppressing the reduction in the mechanical strength of the waveguide structure.

It should be noted that the insulation film 221 insulates the wiring layer 18 from the semiconductor substrate 16. The insulation film 222 is arranged on the insulation film 221 and insulates the wiring layer 14 from the wiring layer 18. A refractive index of the insulation film 222 is lower than a refractive index of the insulation film 221. In addition, the insulation film 223 is arranged on the insulation film 222. A refractive index of the insulation film 222 is also lower than a refractive index of the insulation film 223.

Note that a plurality of insulation films in the waveguide structure respectively may have a thickness that varies depending on the position of the pixel in the pixel array. For example, consider a case where light incident on a pixel in the central region in the pixel array is concentrated on a region near the lower portion of the side face of the substance in the waveguide structure, and where light incident on a pixel in the peripheral region in the pixel array is concentrated on a region away from the lower portion of the side face of the substance in the waveguide structure. In this case, those pixels in the central region in the pixel array are configured so that the film thickness increases in the following order, the insulation film 222, the insulation film 221, and the insulation film 223; whereas, those pixels in the peripheral region in the pixel array are configured so that the film thickness increases in the following order, the insulation film 221, the insulation film 222, and the insulation film 223. Thus, it is possible to effectively increase a difference in refractive indices between the substance 15 and the insulation film 222 in a region where light is concentrated in accordance with a position in the pixel array.

Alternatively, a plurality of insulation films in the waveguide structure respectively may be formed of a material that varies depending on the position of the pixel in the pixel array. For example, consider a case where light incident on a pixel in the central region in the pixel array is concentrated on the lower portion of the side face of the substance in the waveguide structure, where light incident on a pixel in the peripheral region in the pixel array is concentrated on the upper portion of the side face of the substance in the waveguide structure, and where light incident on a pixel in between the central region and the peripheral region in the pixel array is concentrated on the portion between the upper and lower portions of the side face of the substance in the waveguide structure. In this case, the pixels in the central region in the pixel array may have an insulation film 221 formed of a porous CDO and other insulation films 222 and 223 each formed of a silicon oxide. The pixels in between the central and the peripheral regions in the pixel array may have an insulation film 222 formed of a porous CDO and other insulation films 221 and 223 each formed of a silicon oxide. The pixels in the peripheral region in the pixel array may have an insulation film 223 formed of a porous CDO and other insulation films 221 and 222 each formed of a silicon oxide. Thus, it is possible to effectively increase a difference in refractive indices between the substance 15 and the insulation film in a region where light is concentrated in accordance with a position in the pixel array.

Moreover, in this case, the insulation films 222 and 223 in the pixels in the central region in the pixel array may be a single insulation film of a silicon oxide. Also, the insulation films 221 and 222 in the pixels in the peripheral region in the pixel array may be a single insulation film of a silicon oxide. In this case, while each of a pixel in the central region and a pixel in the peripheral region in the pixel array includes two insulation films in the waveguide structure, a pixel in between the central and peripheral region in the pixel array includes three insulation films in the waveguide structure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-218818, filed Aug. 27, 2008, which is hereby incorporated by reference herein in its entirety.

What is claimed is:

1. An image sensor comprising
a pixel array with a plurality of pixels,
wherein each of the plurality of pixels includes:
a photoelectric conversion unit; and
a waveguide structure in which a side face of a substance that has a higher refractive index than a refractive index of a plurality of insulation films is surrounded by the plurality of insulation films so that light is guided to the photoelectric conversion unit,
wherein the plurality of insulation films includes a first insulation film and a second insulation film that is arranged in a position farther from the photoelectric conversion unit than the first insulation film, and
wherein a refractive index of the second insulation film is lower than that of the first insulation film.

2. The image sensor according to claim 1, wherein
the second insulation film is formed of a porous CDO (carbon-doped oxide).

3. An imaging apparatus comprising:
an image sensor according to claim 1;
an optical system that forms an image on an imaging surface of the image sensor; and
a signal processing unit that processes a signal output from the image sensor so as to generate image data.

4. The image sensor according to claim 1, wherein
the second insulation film is arranged adjacent to the first insulation film.

5. The image sensor according to claim 1, wherein
the plurality of insulation films include a third insulation film that is arranged in a position farther from the photoelectric conversion unit than the second insulation film,
wherein the refractive index of the second insulation film is lower than that of the third insulation film.

6. The image sensor according to claim 5, wherein
the refractive index of the first insulation film is lower than that of the third insulation film.

7. The image sensor according to claim 1, wherein
the number of films included in the plurality of insulation films are different with respect to the position in the pixel array of the pixel to which the insulation films belong.

8. The image sensor according to claim 1, wherein a difference in refractive indices between the second insulation film and the first insulation film is approximately 0.1.

9. An image sensor comprising
a pixel array with a plurality of pixels,
wherein each of the plurality of pixels includes:
a photoelectric conversion unit; and
a waveguide structure in which a side face of a substance that has a higher refractive index than a refractive index of a plurality of insulation films is surrounded by the plurality of insulation films so that light is guided to the photoelectric conversion unit,
and wherein the plurality of insulation films includes a first insulation film that insulates a first wiring layer from a semiconductor substrate and a second insulation film that is arranged on the first insulation film and insulates a second wiring layer from the first wiring layer, a refractive index of the second insulation film is lower than that of the first insulation film.

10. An imaging apparatus comprising:

an image sensor according to claim 9;

an optical system that forms an image on an imaging surface of the image sensor; and a signal processing unit that processes a signal output from the image sensor so as to generate image data.

\* \* \* \* \*